(12) United States Patent
Dai

(10) Patent No.: US 11,930,667 B2
(45) Date of Patent: Mar. 12, 2024

(54) DISPLAY PANEL AND METHOD FOR MANUFACTURING THE SAME, AND DISPLAY DEVICE

(71) Applicant: BOE Technology Group Co., Ltd., Beijing (CN)

(72) Inventor: Qing Dai, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 249 days.

(21) Appl. No.: 17/468,550

(22) Filed: Sep. 7, 2021

(65) Prior Publication Data

US 2022/0130923 A1   Apr. 28, 2022

(30) Foreign Application Priority Data

Oct. 26, 2020 (CN) .......................... 202011154772.2

(51) Int. Cl.
*H10K 59/122* (2023.01)
*H10K 71/00* (2023.01)
*H10K 71/13* (2023.01)
*H10K 59/12* (2023.01)

(52) U.S. Cl.
CPC .......... *H10K 59/122* (2023.02); *H10K 71/00* (2023.02); *H10K 71/135* (2023.02); *H10K 59/1201* (2023.02)

(58) Field of Classification Search
None
See application file for complete search history.

(56) References Cited

U.S. PATENT DOCUMENTS

2021/0068232 A1\* 3/2021 Wan ........................ H10K 59/35
2021/0217956 A1\* 7/2021 Im ........................ C23C 14/042

\* cited by examiner

*Primary Examiner* — Michelle Mandala
(74) *Attorney, Agent, or Firm* — IPro, PLLC

(57) ABSTRACT

A display panel is provided. A pixel defining layer of the display panel includes a first defining layer and a second defining layer, wherein the first defining layer includes a first base body and first magnets dispersed in the first base body, and the second defining layer includes a second base body and second magnets dispersed in the second base body; both the first base body and the second base body are hydrophobic and elastic; and a side face of the first base body perpendicular to a bearing surface of the substrate and a side face of the second base body perpendicular to the bearing surface of the substrate being in contact with each other.

20 Claims, 7 Drawing Sheets

DISPLAY PANEL AND METHOD FOR MANUFACTURING THE SAME, AND DISPLAY DEVICE

CROSS-REFERENCE TO RELATED APPLICATION

This application claims priority to Chinese Patent Application No, 202011154772.2, filed on Oct. 26, 2020 and entitled "DISPLAY PANEL AND METHOD FOR MANUFACTURING SAME, AND DISPLAY DEVICE", the disclosure of which is incorporated herein by reference in its entirety.

TECHNICAL FIELD

The present disclosure relates to the field of display technologies, and more particularly to a display panel and a method for manufacturing the same, and a display device.

BACKGROUND

In the display field of organic electroluminescent devices, i.e., organic light-emitting diode (OLED), thin films of an organic functional layer in an OLED display device are usually formed by an inkjet printing method. An essential step of the method is to remove excessive solvent through a subsequent drying process, thereby forming required thin films. The drying process determines the appearance of the finally formed thin films of the organic functional layer. For an organic optoelectronic display device, the appearance and the uniformity of the thickness of the dried thin films of the organic functional layer have relatively big influence on the lifespan and the display effect of the device.

In the process of preparing the OLED display device, the boundary of a pixel is defined by a pixel defining layer. With regard to the inkjet printing process, the surface of the pixel defining layer should have a strong lyophobic property, so as to avoid cross color from occurring in ink between adjacent pixels, and at the same time, and to enable falling ink droplets which are slightly offset roll from the inner edge of a pixel pit into the pixel pit. The shape of the pixel defining layer also determines the aperture ratio of pixels and the shape of the organic functional layer in the pixel pit, and has a relatively big influence on the display effect of the display panel.

It should be noted that the information in the above portion of the background part is only used to enhance the understanding of the background of the present disclosure, and thus it may include information that does not constitute the prior art known to those skilled in the art.

SUMMARY

The present disclosure provides a display panel and a method for manufacturing the same, and a display device. The technical solutions are provided as follows.

In a first aspect of the present disclosure, a display panel is provided. The display panel include: a substrate; a pixel defining layer disposed on the substrate, the pixel defining layer including a plurality of openings, wherein a portion of the pixel defining layer which is disposed between at least partial adjacent two openings of a plurality of adjacent two openings includes a first defining layer and a second defining layer, wherein the first defining layer includes a first base body and first magnets dispersed in the first base body, and the second defining layer includes a second base body and second magnets dispersed in the second base body, both the first base body and the second base body being hydrophobic and elastic, and a side face of the first base body perpendicular to a bearing surface of the substrate and a side face of the second base body perpendicular to the bearing surface of the substrate being in contact with each other, wherein the first magnets and the second magnets are capable of generating repulsive force in a direction parallel to the bearing surface of the substrate, such that a side of the first defining layer distal from the second defining layer is movable towards a direction distal from the second defining layer, and a side of the second defining layer distal from the first defining layer is movable towards a direction distal from the first defining layer; and the first defining layer and the second defining layer is capable of restoring to original states after the repulsive force disappears.

In some embodiments, the first magnets are permanent magnets, and the second magnets are paramagnets.

In some embodiments, a material of the permanent magnets includes an Al—Ni—Co material, a Fe—Cr—Co material or a rare-earth material, and a material of the paramagnet includes lithium or sodium.

In some embodiments, both a material of the first base body and a material of the second base body are adhesive, and the first base body and the second base body bond together to be an integral structure in the direction parallel to the bearing surface of the substrate.

In some embodiments, both the material of the first base body and the material of the second base body include adhesive rubber or thermoplastic resin.

In some embodiments, a material of the first base body is the same as a material of the second base body, and the first base body and the second base body are an integral structure.

In some embodiments, both the material of the first base body and the material of the second base body include an organic material of fluoropolymer rubber.

In some embodiments, the plurality of openings are arranged along a row direction and a column direction in an array; and the portion of the pixel defining layer including the first defining layer and the second defining layer is disposed between any two adjacent openings in the row direction.

In some embodiments, a distance from the side of the first defining layer distal from the second defining layer to the side of the second defining layer distal from the first defining layer decreases gradually in a direction distal from the substrate.

In some embodiments, the display panel further includes: a pixel defining base layer, wherein the pixel defining base layer is disposed between the substrate and the pixel defining layer, and a material of the pixel defining base layer is a hydrophilic material.

In some embodiments, the display panel further includes: a pixel electrode, wherein the pixel electrode is disposed on the substrate and exposed from the opening; and the pixel defining base layer further covers an edge area of the pixel electrode.

In a second aspect of the present disclosure, a method for manufacturing a display panel is provided. The method includes: providing a substrate; forming a pixel defining layer including a plurality of openings on the substrate, a pixel defining layer disposed on the substrate, wherein a portion of the pixel defining layer which is disposed between at least partial adjacent two openings of a plurality of adjacent two openings includes a first defining layer and a second defining layer, wherein the first defining layer includes a first base body and first magnets dispersed in the first base body, and the second defining layer includes a second base body and second magnets dispersed in the second base body, both the first base body and the second base body being hydrophobic and elastic, and a side face of the first base body perpendicular to a bearing surface of the substrate and a side face of the second base body perpendicular to the bearing surface of the substrate being in contact with each other; controlling the first magnets and the second magnets to generate repulsive force in a direction parallel to the bearing surface of the substrate, such that a side of the first defining layer distal from the second defining layer moves towards a direction distal from the second defining layer, and a side of the second defining layer distal from the first defining layer moves towards a direction distal from the first defining layer; printing ink made of a material of a light emitting functional layer in the openings; forming the light-emitting functional layer by drying the ink in the openings; and controlling the repulsive force between the first magnets and the second magnets to disappear, such that the first defining layer and the second defining layer restore to original states.

In some embodiments, when the pixel defining layer including the first defining layer and the second defining layer is formed, a distance from the side of the first defining layer distal from the second defining layer to the side of the second defining layer distal from the first defining layer decreases gradually in a direction distal from the substrate.

In some embodiments, the first magnets are permanent magnets, and the second magnets are paramagnets; controlling the first magnets and the second magnets to generate the repulsive force in the direction parallel to the bearing surface of the substrate includes: applying a magnetic field to the first magnets and the second magnets, such that magnetic force of the first magnets and magnetic force of the second magnets repel each other; and controlling the repulsive force between the first magnets and the second magnets to disappear includes: removing the magnetic field.

In some embodiments, controlling the first magnets and the second magnets to generate the repulsive force in the direction parallel to the bearing surface of the substrate includes: controlling strength of the magnetic field, such that a distance from the side of the first defining layer distal from the second defining layer to the side of the second defining layer distal from the first defining layer increases gradually in a direction distal from the substrate after the side of the first defining layer and the side of the second defining layer move.

In some embodiments, printing the ink made of the material of the light emitting functional layer in the openings includes: printing the ink made of the material of the light emitting functional layer in the openings through an inkjet printing process.

In some embodiments, before forming the pixel defining layer including the plurality of openings on the substrate, the method further includes: forming a pixel defining base layer on the substrate, wherein a material of the pixel defining base layer is a hydrophilic material; and forming the pixel defining layer including the plurality of openings on the substrate includes: forming the pixel defining layer including the plurality of openings on a side of the pixel defining base layer distal from the substrate.

In a third aspect of the present disclosure, a display device is provided. The display device includes a power supply component and a display panel, wherein the power supply component is connected to the display panel, and the power supply component is configured to supply power to the display panel; and the display panel includes: a substrate; a pixel defining layer disposed on the substrate, the pixel defining layer including a plurality of openings, wherein a portion of the pixel defining layer which is disposed between at least partial adjacent two openings of a plurality of adjacent two openings includes a first defining layer and a second defining layer, wherein the first defining layer includes a first base body and first magnets dispersed in the first base body, and the second defining layer includes a second base body and second magnets dispersed in the second base body, both the first base body and the second base body being hydrophobic and elastic, and a side face of the first base body perpendicular to a bearing surface of the substrate and a side face of the second base body perpendicular to the bearing surface of the substrate being in contact with each other, wherein the first magnets and the second magnets are capable of generating repulsive force in a direction parallel to the bearing surface of the substrate, such that a side of the first defining layer distal from the second defining layer is movable towards a direction distal from the second defining layer, and a side of the second defining layer distal from the first defining layer is movable towards a direction distal from the first defining layer; and the first defining layer and the second defining layer is capable of restoring to original states after the repulsive force disappears.

It is to be understood that the foregoing general descriptions and the following detailed descriptions are only exemplary and explanatory, and do not limit the scope of the present disclosure.

BRIEF DESCRIPTION OF THE DRAWINGS

The accompanying drawings herein are incorporated in and constitute a part of this specification. The accompanying drawings show the embodiments in comply with the present disclosure and serve to explain the principles of the present disclosure together with the specification. Apparently, the accompanying drawings in the following descriptions show merely some embodiments of the present disclosure, and persons of ordinary skill in the art may still derive other drawings from these drawings without creative efforts.

DESCRIPTIONS OF THE DRAWINGS

Figure 1:
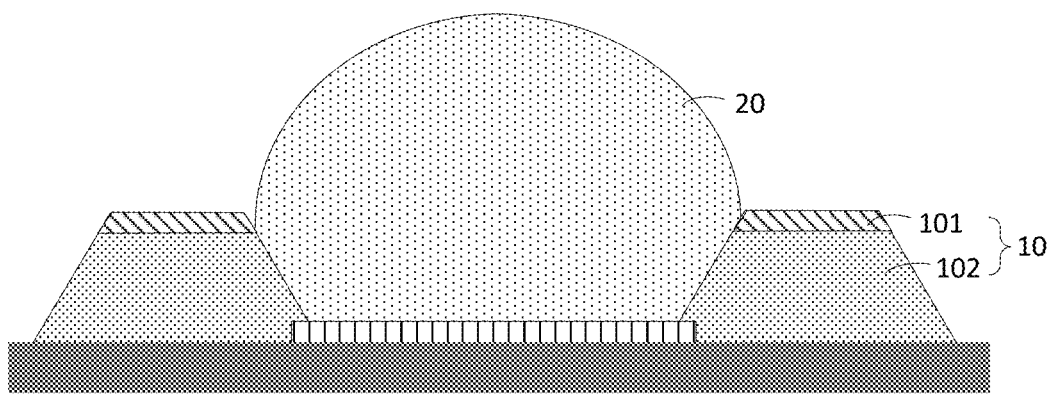
FIG. 1 is a schematic diagram of the structure of a pixel defining layer in a display panel in the related art.
Figure 2:
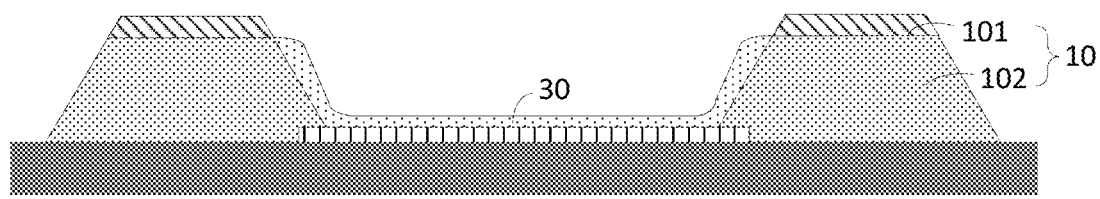
FIG. 2 is a schematic diagram of the structure of an organic functional layer in a display panel in the related art.
Figure 9:
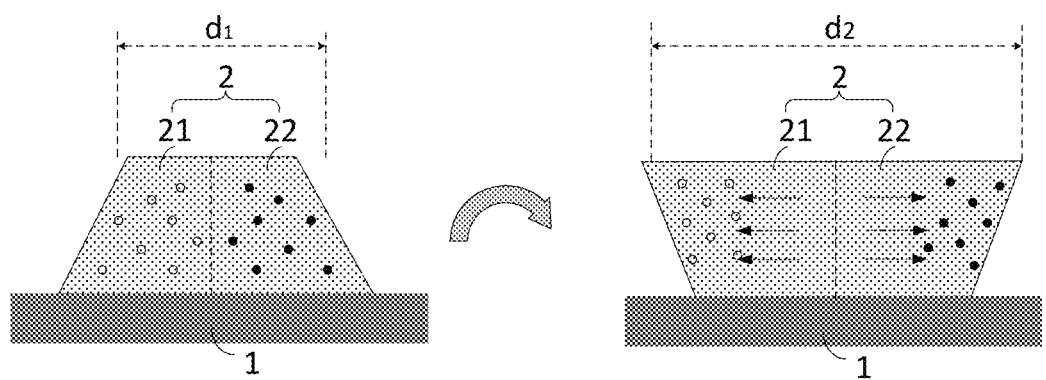
FIG. 9 is a schematic diagram showing a first structure change of the pixel defining layer according to an embodiment of the present disclosure.
Figure 10:
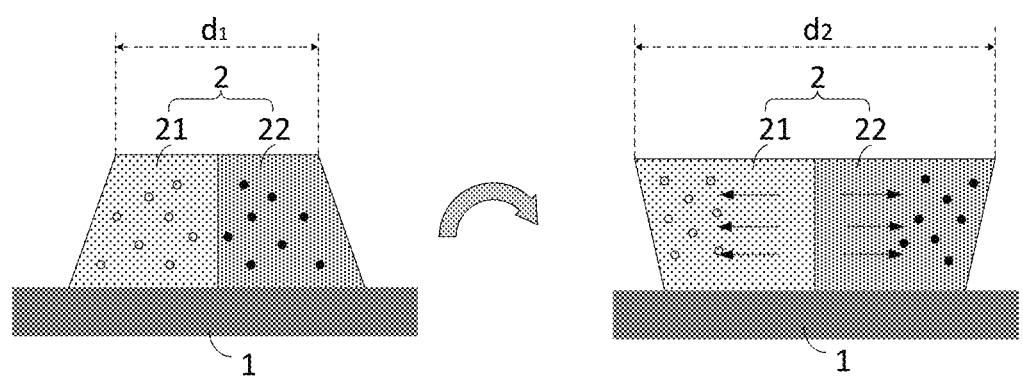
FIG. 10 is a schematic diagram showing a second structure change of the pixel defining layer according to an embodiment of the present disclosure.

In FIG. 1 to FIG. 2, 10—pixel defining layer; 101—hydrophobic layer; 20—ink droplet; 30—organic functional layer; and in FIG. 3 to FIG. 21, 1—substrate; 2—pixel defining layer; 20—opening; 21—first defining layer; 22—second defining layer; 211—first base body; 212—first magnet; 221—second base body; 222—second magnet; 3—ink droplet; 4—organic functional layer; 5—pixel defining base layer; 6—pixel electrode; J1—power supply component; 00—display panel.

DETAILED DESCRIPTION

The example embodiments are described more thoroughly hereinafter with reference to the accompanying drawings. However; the example embodiments can be implemented in multiple fashions; and should not be understood to be limited to the implementations explained herein. On the contrary, with the example embodiments herein, the embodiments of the present disclosure are fully and completely conveyed to, and the concept of the example embodiments is completely conveyed to those skilled in the art. The same reference signs in the drawings indicate the same or similar structures, and thus the detailed descriptions thereof are omitted.

In the related art, a pixel defining layer 10 usually includes a lyophobic layer, which plays a function of defining the boundary of pixels. A relatively large ink deposition area is formed in openings in the center of the pixel defining layer 10.

One method for preparing the lyophobic layer is to mix a lyophobic material in the lyophilic material. However, in the process of forming the pixel defining layer 10, the lyophobic material is easily separated from the lyophilic material and moves to the top. Therefore, there is only a thin lyophobic layer 101 on the surface of the pixel defining layer 10, while the lyophilic material 102 occupies the most part of the lower layer, as shown in FIG. 1, which results in that the hydrophobicity of the pixel defining layer 10 to ink droplets 20 in a pixel pit (i.e., the ink deposition area) lowers down, and cross color easily occurs in the ink droplets 20 (i.e., ink) between adjacent pixels. One method to prevent cross color is to increase the width of the pixel defining layer 10, but this method has an obvious disadvantage, that is, the aperture ratio is reduced.

Figure 3:
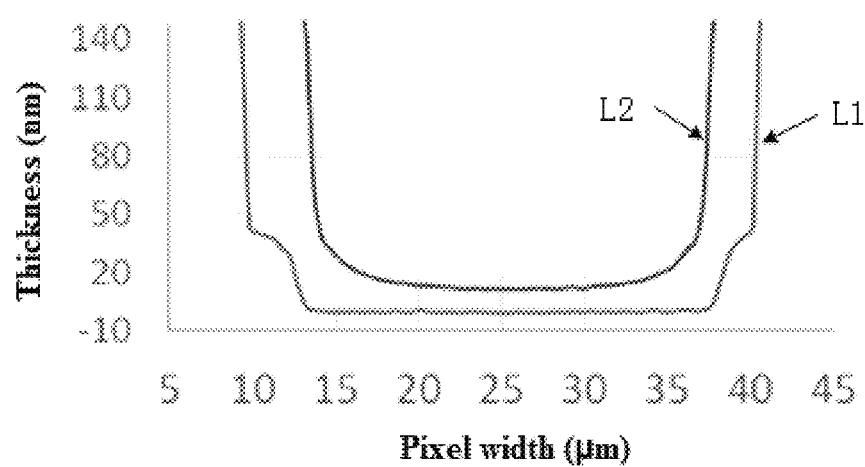
FIG. 3 is a schematic diagram of an actually-measured cross-sectional contour of the organic functional layer in FIG. 2.

On the other hand, a boundary line is formed between the lyophilic layer and the lyophobic layer of the pixel defining layer 10, and the boundary line has a pinning effect. In the process of inkjet printing, the edge of the ink droplet 20 dropping into the pixel pit may easily stay at the boundary line, such that the coffee-ring effect is particularly obvious after the ink droplet 20 dries. FIG. 1 also shows the shape of the ink droplet 20 when it drops into the pixel pit. FIG. 2 shows a schematic diagram when an organic functional layer 30 is formed in the pixel pit after the ink droplet 20 dries. FIG. 3 is a schematic diagram of actually-measured cross-sectional contour of an organic functional layer (for example, a hole transport layer) after the ink droplet 20 dries. Here, the horizontal ordinate in FIG. 3 indicates a pixel width, with unit of micron (μm), and the pixel width is calculated from the position of the dividing line at the left side in FIG. 2. The vertical ordinate indicates a thickness, with a unit of nanometer (nm). L1 is a thickness change curve of the pixel defining layer 10, and L2 is a thickness change curve of the organic functional layer 30. From FIG. 2 and FIG. 3, it can be known that most of organic functional materials are disposed at the slope of the pixel defining layer 10, due to the coffee-ring effect. The organic functional layer 30 formed is thin in the center portion and thick in the edge portion, and has relatively low flatness on the whole. As a result, the brightness of the light-emitting device is not uniform when it is lighted up, and thus the utilization efficiency of the organic functional materials also decreases greatly.

For the above technical problems, an embodiment of the present disclosure provides a display panel, and the structure of a pixel defining layer of the display panel can avoid the above problem.

Figure 4:
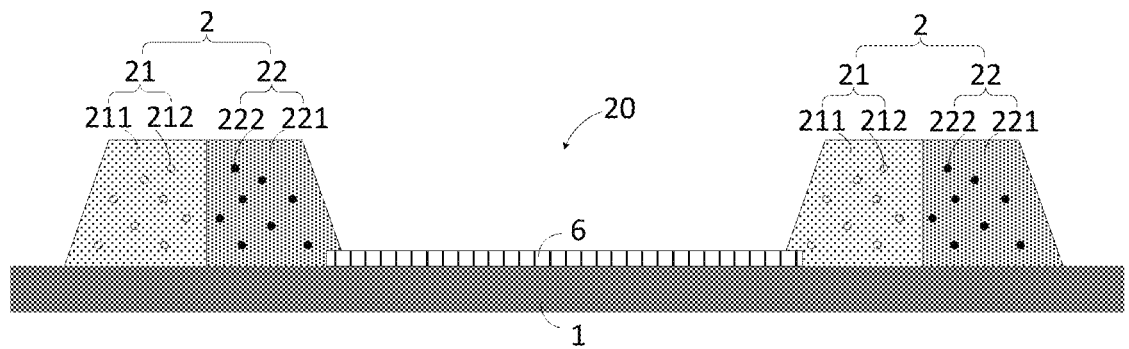
FIG. 4 is a schematic diagram of a structure of a pixel defining layer according to an embodiment of the present disclosure.

As shown in FIG. 4, it shows a schematic diagram of a cross-section of a structure of a sub-pixel of the display panel according to an embodiment of the present disclosure. The display panel includes a substrate 1 and a pixel defining layer 2 which is disposed on the substrate 1 and has a plurality of openings. The portion of the pixel defining layer 2 which is disposed between least partial adjacent two openings of a plurality of adjacent two openings includes a first defining layer 21 and a second defining layer 22. That is, as shown in FIG. 4, the pixel defining layer 2 between two openings 20 includes the first defining layer 21 on the left and the second defining layer 22 on the right.

The first defining layer 21 includes a first base body 211 and first magnets 212 dispersed in the first base body 211, and the first base body 211 is hydrophobic and elastic. The second defining layer 22 includes a second base body 221 and second magnets 222 dispersed in the second base body 221, and the second base body 221 is hydrophobic and elastic. In addition, a side face, perpendicular to the bearing surface of the substrate 1, of the first base body 211 and a side face, perpendicular to the bearing surface of the substrate 1, of the second base body 221 are in contact with each other. The direction parallel to the bearing surface of the substrate 1 may also be understood as the plane direction of the pixel defining layer 2 (i.e., the horizontal direction).

Based on the above structure and properties of magnetic materials, when the magnetic property of the first magnets 212 and the magnetic property of the second magnets 222 repel each other and generate repulsive force, the side of the first defining layer 21 which is distal from the second defining layer 22 can move towards the direction distal from the second defining layer 22, and the side of the second defining layer 22 which is distal from the first defining layer 21 can move towards the direction distal from the first defining layer 22. That is, referring to FIG. 5, the first magnets 212 can push the first base body 211 with elasticity to move to the left, and the second magnets 222 can push the second base body 221 with elasticity to move to the right. In other words, the first defining layer 21 and the second defining layer 22 extend laterally towards directions distal from each other, and finally the position of the left side of the first defining layer 21 moves towards the left, while the position of the right side of the second defining layer 22 moves towards the tight. Apparently, when the first magnets 212 and the second magnets 222 generate the repulsive force, the distance between the left side of the first defining layer 21 and the right side of the second defining layer 22 is wider than the distance therebetween when no repulsive force is generated. In the embodiment of the present disclosure, the width of the pixel defining layer 2 is the distance between the left side of the first defining layer 21 and the right side of the second defining layer 22, that is, the width of the pixel defining layer 2 is broadened when the repulsive force is generated between the first magnets 212 and the second magnets 222. Since the pixel defining layer 2 is formed on the substrate 1 and has a certain thickness, the lower surface of the pixel defining layer 2 is restrained by the substrate 1. Therefore, the displacement of the lower surfaces of the first defining layer 21 and the second defining layer 22 is less than that of the upper surfaces. On the whole, the closer the portion of the pixel defining layer 2 to the top is, the larger the deformation is, and the angle of slope increases compared with that when no repulsive force exists.

After the repulsive force between the first magnets 212 and the second magnets 222 disappears, since the first base body 211 and the second base body 221 have elasticity, the first defining layer 21 and the second defining layer 22 can restore to the original states, that is, the width of the pixel defining layer 2 restore to the original size.

It should be noted that the distance between the left side of the first defining layer 21 and the right side of the second defining layer 22 may be the distance between the left side and the right side in any horizontal plane, or may be the average distance between the left side and the right side.

Thus, it can be known that the pixel defining layer 2 according to the embodiment of the present disclosure may be deformed reversibly under certain conditions, which is helpful to print the organic functional layer in the openings 20 (i.e., the pixel pits) through inkjet printing in the subsequent process.

Figure 5:
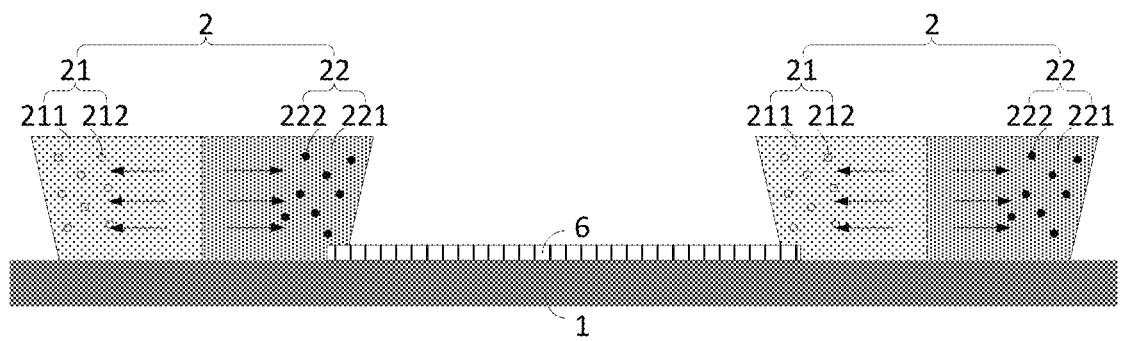
FIG. 5 is a schematic diagram of the structure of the pixel defining layer in FIG. 4 when it is deformed.
Figure 6:
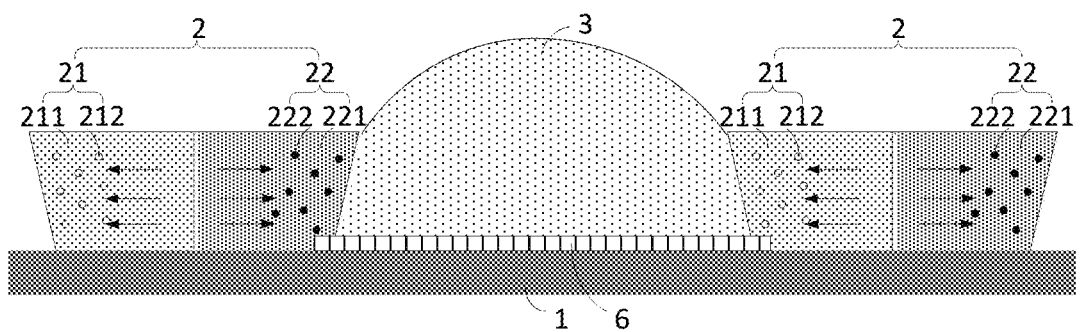
FIG. 6 is a schematic diagram of the structure of the pixel defining layer in FIG. 5 after ink is dropped in openings of the pixel defining layer.
Figure 7:
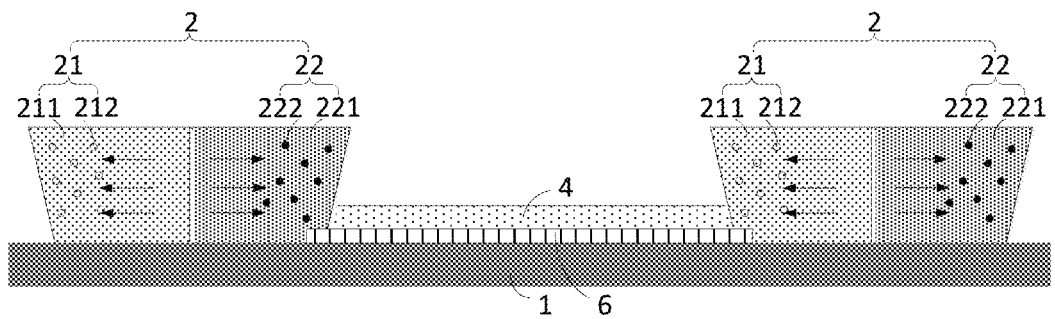
FIG. 7 is a schematic diagram of a structure of the organic functional layer formed after the ink is dried in FIG. 6.

Specifically, after the pixel defining layer 2 is prepared, as shown in FIG. 5, the first magnets 212 and the second magnets 222 may be controlled to generate repulsive force, such that the width of the pixel defining layer 2 is broadened. Referring to FIG. 6, ink droplets 3 containing organic functional materials may be further printed in the openings 20 (i.e., the pixel pits). Since the width of the pixel defining layer 2 is broadened, the width of the top portion generally changes greatly, and the hydrophobic effect of the top portion on the ink droplets 3 is enhanced, which can effectively prevent cross color from occurring in the ink droplets 3. In addition, as shown in FIG. 7, since the angle of slope of the pixel defining layer 2 increases, a slope does not easily form on the organic functional layer 4 formed after the ink droplets 3 dry, such that the flatness is improved and the uniformity of the brightness of a device when illuminated is improved.

Figure 8:
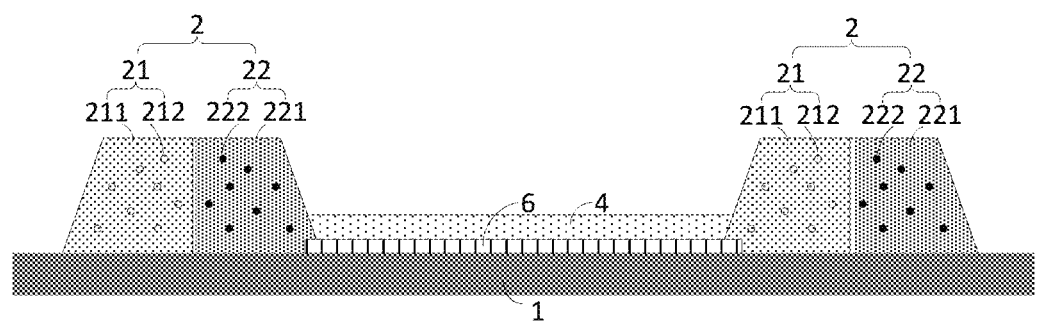
FIG. 8 is a schematic diagram of the structure of the pixel defining layer in FIG. 7 when it has restored to an original state.

After the ink droplets 3 are dried, the repulsive force between the first magnets 212 and the second magnets 222 may further be controlled to disappear. In this case, as shown in FIG. 8, the pixel defining layer 2 may restore to the original shape. Since the width of the pixel defining layer 2 is not changed finally, the requirement of the high resolution on size is not affected. Furthermore, based on this principle, as long as it is ensured that the width of the deformed pixel defining layer 2 can satisfy hydrophobic requirements, the width of the pixel defining layer 2 may be made as narrow as possible, such that the aperture ratio can be improved under the premise that the width of the pixel defining layer 2 is not increased. Meanwhile, since the pixel defining layer 2 of the display panel does not have the dividing line between the lyophilic layer and the lyophobic layer in the related art, the unevenness of the thickness of the organic functional layer 4 caused by the coffee-ring effect is improved.

Optionally, referring to FIG. 4 to FIG. 8, it can be known that the display panel may further include a pixel electrode 6. The pixel electrode 6 is disposed on the substrate 1, and the openings 20 of the pixel defining layer 2 expose the pixel electrode 6.

In the embodiment of the present disclosure, when there is no repulsive force between the first magnets 212 and the second magnets 222, a side face, perpendicular to a plane direction of the pixel defining layer 2 (that is, the horizontal direction), of the first base body 211 and a side face, perpendicular to the plane direction of the pixel defining layer 2, of the second base body 221 are in contact with each other. The term "contact" may include multiple forms.

For example, in an embodiment, the materials of the first base body 211 and the second base body 221 are the same, and the first base body 211 and the second base body 221 are an integral structure. In this case, it may be deemed that the first base body 211 and the second base body 221 are in contact with each other and have a close connection relation. In another embodiment, the first base body 211 and the second base body 221 are two independent structures made separately, but the first base body 211 and the second base body 221 are not only in contact with each other but also bonded to each other. In this case, it may be deemed that the first base body 211 and the second base body 221 are in contact with each other and in a connection relation. If the first base body 211 and the second base body 221 are only in contact with each other, but not bonded to each other, that is, they can be separated, it may be deemed that the first base body 211 and the second base body 221 are only in contact with each other but not in a connection relation. Thus, the contact relation between the first base body 211 and the second base body 221 is related to materials thereof, and the contact relation may also affect the deformation state under the repulsive force.

Referring to FIG. 9, it shows a change of the structure of the pixel defining layer 2 in an embodiment. In this embodiment, the first base body 211 and the second base body 221 are made of the same material and are an integral structure. The dashed line in the figure indicate a dividing line between the first base body 211 and the second base body 221. When the first base body 211 and the second base body 221 move to two sides under the pulling force of magnetic materials, the pixel defining layer 2 extends integrally towards the two sides, which plays a hydrophobic function and a function of preventing the organic functional layer from climbing. After the repulsive force between the magnets disappears, the pixel defining layer 2 may restore to the original shape smoothly. In this embodiment, the materials of the first base body 211 and the second base body 221 may be organic materials having good elasticity and hydrophobicity, such as fluoropolymer rubber. For example, the organic material may be polydimethylsiloxane (PDMS) and the like.

Referring to FIG. 10, it shows a change of the structure of the pixel defining layer 2 in another embodiment. In this embodiment, the materials of the first base body 211 and the second base body 221 are adhesive, and the first base body 211 and the second base body 221 are bonded to be an integral structure. When the first base body 211 and the second base body 221 move to two sides under the pulling force of the magnetic materials, the first base body 211 and the second base body 221 can maintain a secure connection therebetween, such that the pixel defining layer 2 is always an integral structure. The structure not only has a hydrophobic function and a function of preventing the organic functional layer 4 from climbing, but also prevents other structures on the substrate 1 from being easily be eroded by water or oxygen in the inkjet printing process. When the repulsive force between the first base body 211 and the second base body 221 disappears and the first base body 211 and the second base body 221 restore to the original states, the bonding force also helps the first base body 211 and the second base body 221 restore to the original states. In this embodiment, the materials of the first base body 211 and the second base body 221 are preferably adhesive rubber or thermoplastic resin, for example, PDMS, thermoplastic vulcanizate (TPV), thermoplastic polyester elastomer (TPEE), or polyolefin thermoplastic elastomer (TPO). Generally, in order to satisfy the lyophobic characteristics required by printing, it is necessary to add fluorine-containing small molecules of low surface energy to base materials. This kind of materials have good hydrophobicity and elasticity, and have an ideal recovering ability after deformation. This kind of materials also have a relatively high cohesiveness and thus are not easily separated. In addition, in this embodiment, the materials of the first base body 211 and the second base body 221 may be the same or different.

Figure 11:
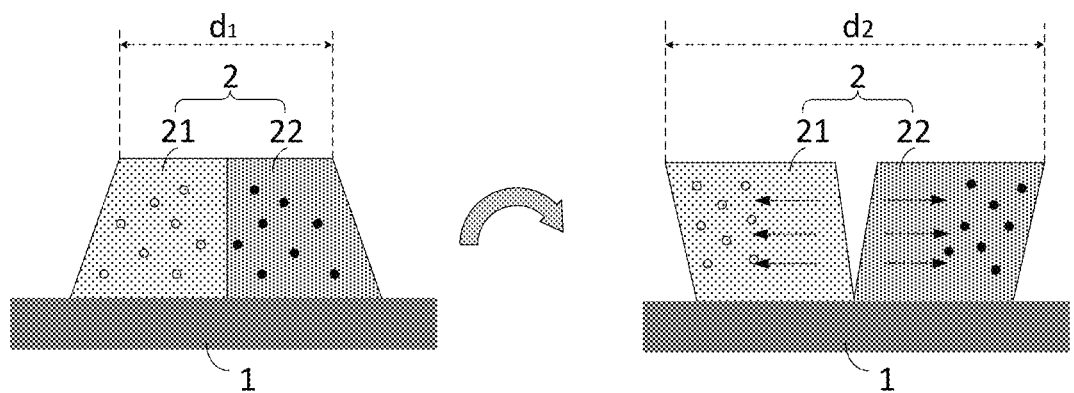
FIG. 11 is a schematic diagram showing a third structure change the pixel defining layer according to an embodiment of the present disclosure.

Referring to FIG. 11, it shows a change of the structure of the pixel defining layer 2 in yet another embodiment. In this embodiment, the first base body 211 and the second base body 221 are two independent structures made separately, and the first base body 211 and the second base body 221 are only in contact with each other but not bonded to each other. When the first base body 211 and the second base body 221 move to two sides under the pulling force of magnetic materials, the first base body 211 and the second base body 221 may be separated, such that a gap is formed in the center of the pixel defining layer 2. In this case, the width of the pixel defining layer 2 includes the width of the gap. Although there is a gap, the gap does not affect the subsequent step of printing the organic functional layer 4. The width of the pixel defining layer 2 may still be broadened and the angle of slope may still get bigger, and the pixel defining layer 2 may still have the hydrophobic function and the function of preventing the organic functional layer 4 from climbing. When the repulsive force between the first base body 211 and the second base body 221 disappears and the first base body 211 and the second base body 221 restore to the original shapes, the gap also disappears. In this embodiment, the materials of the first base body 211 and the second base body 221 may be organic materials having good elasticity and hydrophobicity, such as fluoropolymer rubber. In addition, in this embodiment, the materials of the first base body 211 and the second base body 221 may be the same or different.

It should be noted that, in FIG. 9 to FIG. 11, the reference sign $d_1$ indicates the width of the pixel defining layer 2 when it is not deformed, and $d_2$ indicates the width of the pixel defining layer 2 when it is deformed. It can be seen from the figures that $d_2 > d_1$.

In the embodiment of the present disclosure, the repulsive force generated by the first magnets 212 and the second magnets 222 in the horizontal direction is related to the magnetic properties of the materials of the magnets. Generally, when the magnetic property of the first magnets 212 is opposite to that of the second magnets 221, the repulsive force exists therebetween.

Figure 12:
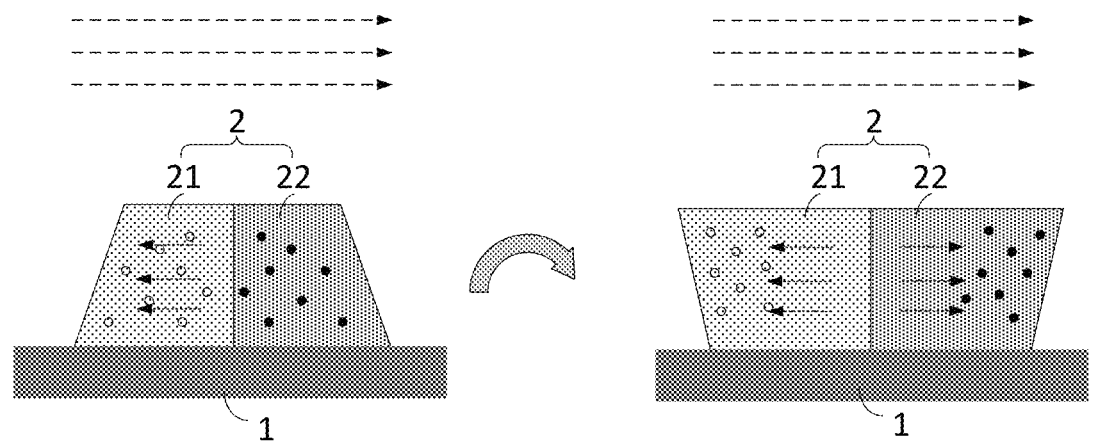
FIG. 12 is a first schematic diagram showing forming of repulsive force according to an embodiment of the present disclosure.
Figure 13:
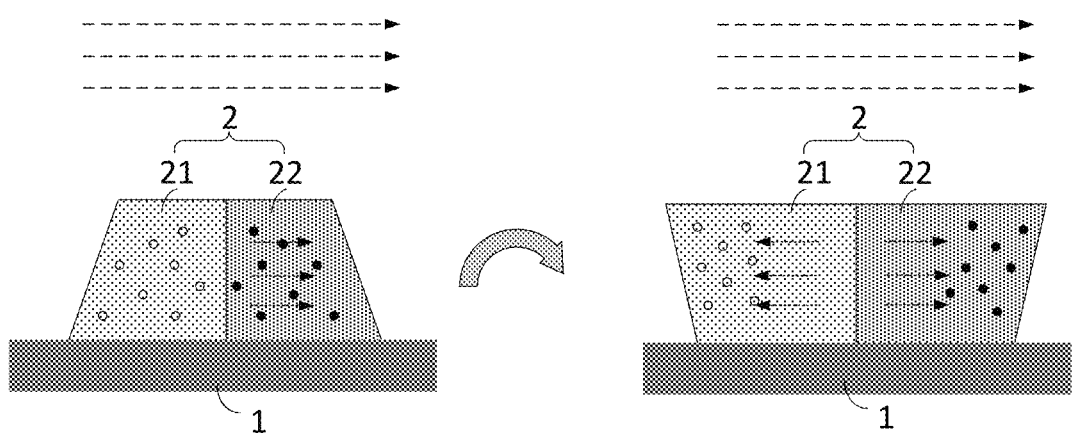
FIG. 13 is a second schematic diagram showing forming of repulsive force according to an embodiment of the present disclosure.

In this embodiment, the first magnets 212 may be permanent magnets, and the second magnets 221 may be paramagnets. The permanent magnets are magnets that can maintain their magnetic properties for a long time. Paramagnets are magnets that has the ability to produce magnetic force consistent with the direction of the magnetic field under the action of an external magnetic field, and the magnetic force disappears when the external magnetic field is removed. Referring to FIG. 12, it shows a change of the structure of the pixel defining layer 2 in this embodiment. The magnetic property of the permanent magnet is towards the left. When the organic functional layer 4 is printed, a magnetic field with a direction opposite to the magnetic property of the permanent magnet may be applied to the second magnets 222 (that is, a magnetic field towards the right, the dashed line at the upper side of the figure indicates the direction of the applied magnetic field), such that the second magnets 222 generate rightward magnetic force, thereby generating repulsive force between the first base body 211 and the second base body 221. Therefore, the first base body 211 and the second base body 221 are pushed to move towards two sides. In another embodiment, as shown in FIG. 13, the first magnets 212 may be paramagnets, and the second magnets 221 may be permanent magnets with a rightward magnetic property.

In the above solution, the material of the permanent magnets includes, but is not limited to, an Al—Ni—Co material, a Fe—Cr—Co material, a rare-earth material or the like magnetic material. The material of paramagnets includes, but is not limited to, metal with conducting electrons, such as lithium (Li), sodium (Na) or the like.

In the embodiment of the present disclosure, under the situation of no repulsive force, the pixel defining layer 2 preferably adopts a regular trapezoid shaped structure as shown in FIG. 4, that is, the distance between the left side of the first defining layer 21 and the right side of the second defining layer 22 decreases gradually from bottom to top. In other words, the width of the pixel defining layer 2 decreases gradually from bottom to top. For an inverted trapezoid shaped structure opposite to the regular trapezoid shaped structure, the width of the pixel defining layer 2 increases gradually from the bottom to the top. When the pixel defining layer 2 adopts the inverted trapezoid shaped structure, a cathode layer easily breaks at the edge of the pixel defining layer 2 during forming the cathode layer subsequently. The pixel defining layer 2 with a regular trapezoid shaped structure can prevent the cathode layer from breaking.

Figure 14:
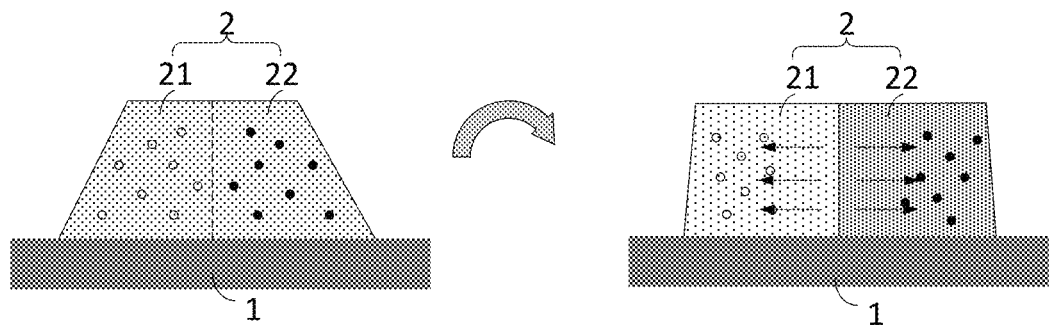
FIG. 14 is a schematic diagram showing a fourth structure change of the pixel defining layer according to an embodiment of the present disclosure.

When repulsive force exits between the first magnets 212 and the second magnets 222, the distance for which the left side of the first defining layer 21 and the right side of the second defining layer 22 move towards two sides is determined by the magnitude of the repulsive force. For example, as shown in FIG. 14, when the repulsive force is relatively small, the distance for which the left side of the first defining layer 21 and the right side of the second defining layer 22 move towards two sides is relatively short, the deformation of the pixel defining layer 2 is relatively small, and thus the integral shape is still a regular trapezoid shaped structure. When the repulsive force is relatively large, as shown in FIG. 9 to FIG. 11, the distance for which the left side of the first defining layer 21 and the right side of the second defining layer 22 move towards two sides is relatively large, the deformation of the pixel defining layer 2 is relatively large, and the inverted trapezoid shaped structure may be formed. Regardless of the shape, compared with the situation where there is no repulsive force, the width of the pixel defining layer 2 is increased, and the angle of slope is increased, which can have a hydrophobic function and a function of preventing the film layer from climbing. Compared with the regular trapezoid shaped structure, the inverted trapezoid shaped structure has a more significant effect in preventing the film layer from climbing.

Figure 15:
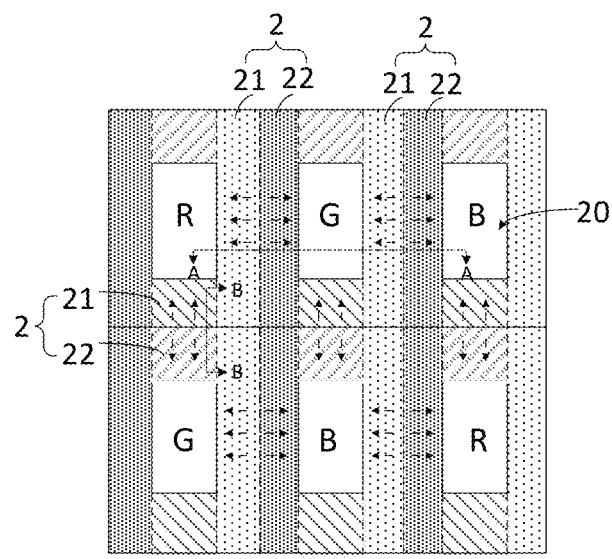
FIG. 15 is a first top view of the structure of a display panel according to an embodiment of the present disclosure.

The cross-sectional structure of the pixel defining layer is described above. Referring to FIG. 15, it shows a top view of the structure of a display panel according to an embodiment of the present disclosure. The display panel includes a plurality sub-pixels. Six sub-pixels are illustrated in FIG. 15. The six sub-pixels are arranged along a row direction and a column direction in an array. The upper three sub-pixels are sequentially a red sub-pixel, a green sub-pixel and a blue sub-pixel, and the lower three sub-pixels are sequentially a green sub-pixel, a blue sub-pixel and a red sub-pixel. Correspondingly, the pixel defining layer 2 has six openings 20. In this embodiment, a portion of the pixel defining layer 2 which is disposed between two openings 20 in the row direction and the column direction is set to be the structure of the first defining layer 21 and the structure of the second defining layer 22. That is, for each sub-pixel, the pixel defining layer 2 around the sub-pixel is divided into an upper part, a lower part, a left part and a right part, and repulsive force may be generated between each part and the corresponding part of the pixel defining layer 2 of an adjacent sub-pixel. For example, the pixel defining layer at the right of the red sub-pixel in the first row and the pixel defining layer at the left of the green sub-pixel in the first row may mutually generate repulsive force, and thus they are stretched towards the left and the right sides respectively. The pixel defining layer at the right of the green sub-pixel in the first row and the pixel defining layer at the left of the blue sub-pixel in the first row may mutually generate repulsive force, and thus they are stretched towards the left and right sides respectively. The pixel defining layer below the red sub-pixel in the first row and the pixel defining layer above the green sub-pixel in the second row may mutually generate repulsive force, and thus they are stretched upwards and downwards respectively. When stretched, the entire widths of the two defining layers are broadened, and the pixel defining layers achieves an improved hydrophobic effect and improved effect of preventing the film layer from climbing. Among the four parts of the pixel defining layer in the figure, areas of the upper part and the lower part are smaller than areas of the left part and the right part. This division is only an example, and the pixel defining layer may be divided in other ways in other embodiments. The sectional structure as shown in FIG. 4 to FIG. 8 may be deemed as a cross-sectional view along the direction A-A in FIG. 15, or as a cross-sectional view along the direction B-B in FIG. 15.

Figure 16:
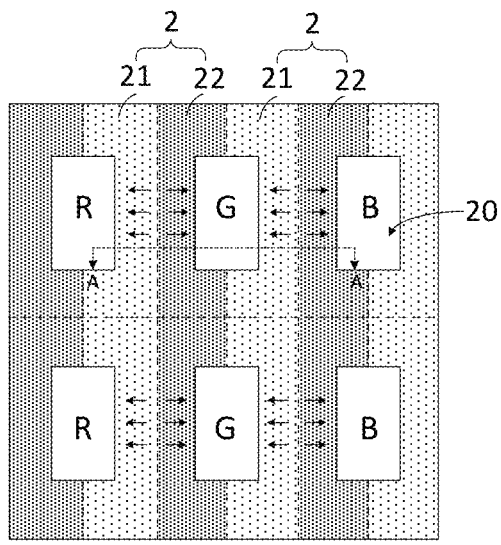
FIG. 16 is a second top view of the structure of a display panel according to an embodiment of the present disclosure.

Referring to FIG. 16, it shows a top view of the structure of the display panel according to another embodiment of the present disclosure. Different from FIG. 15, the upper three sub-pixels and the lower three sub-pixels are respectively the red sub-pixel, the green sub-pixel and the blue sub-pixel. In this embodiment, since the colors of the sub-pixels in the column direction are the same, there is no high requirement on preventing cross color. In an actual product, sub-pixels in the column direction are generally far apart, and therefore, only the portion of the pixel defining layer 2 which is disposed between the two openings 20 in the row direction is set to be the structure of the first defining layer 21 and the structure of the second defining layer 22. That is, for each sub-pixel, the pixel defining layer 2 around the sub-pixel is divided into a left part and a right part, and each part may form repulsive force with the corresponding part of the pixel defining layer 2 of the adjacent sub-pixel. For example, the pixel defining layer at the right side of the red sub-pixel in the first row and the pixel defining layer at the left side of the green sub-pixel in the first row may mutually generate repulsive force, such that the two pixel defining layers are stretched towards the left and the right sides respectively. When they are stretched, the entire widths of the two defining layers are broadened, and the hydrophobic effect and the effect of preventing the film layer from climbing are improved. In the top view, the covered areas of the first defining layer 21 and the second defining layer 22 are symmetrical to each other. This division is only exemplary, and in other embodiments, the pixel defining layer may also be divided in other methods. The cross-sectional structure as shown in FIG. 4 to FIG. 8 may be deemed as a cross-sectional view along the direction A-A in FIG. 16.

Thus, it can be known that the portion of the pixel defining layer which is disposed between at least partial adjacent two openings of a plurality of adjacent two openings includes the above first defining layer and the second defining layer.

Since the above pixel defining layer is made of hydrophobic materials, and furthermore, in an embodiment of the present disclosure, the display panel may further include a pixel defining base layer 5. The pixel defining base layer 5 is located (i.e., disposed) between the substrate 1 and the pixel defining layer 2.

Figure 17:
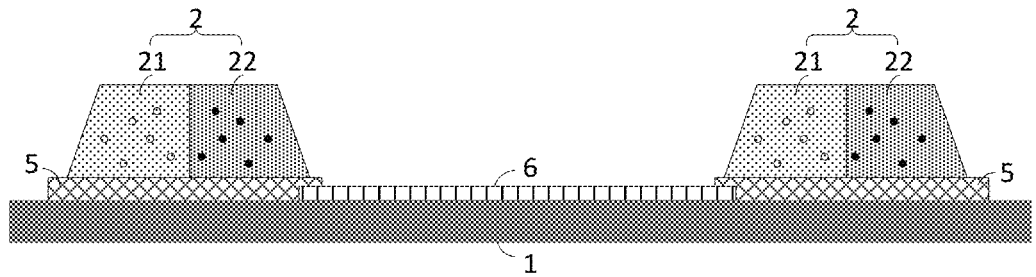
FIG. 17 is a schematic diagram of a structure including a pixel defining base layer according to an embodiment of the present disclosure.

Optionally, as shown in FIG. 17, the pixel defining base layer 5 is generally wider than the pixel defining layer 2, and covers the peripheral area of pixel electrode. The pixel defining base layer 5 is made of hydrophilic materials, which can avoid short circuit and tip discharge, Since the pixel defining layer 2 is disposed on the pixel defining base layer 5, the lower surface of the pixel defining layer 2 is restrained by the pixel defining base layer 5. When the pixel defining layer 2 is deformed, the upper portion deforms greater than the lower portion does, which is not repeated herein.

Figure 18:
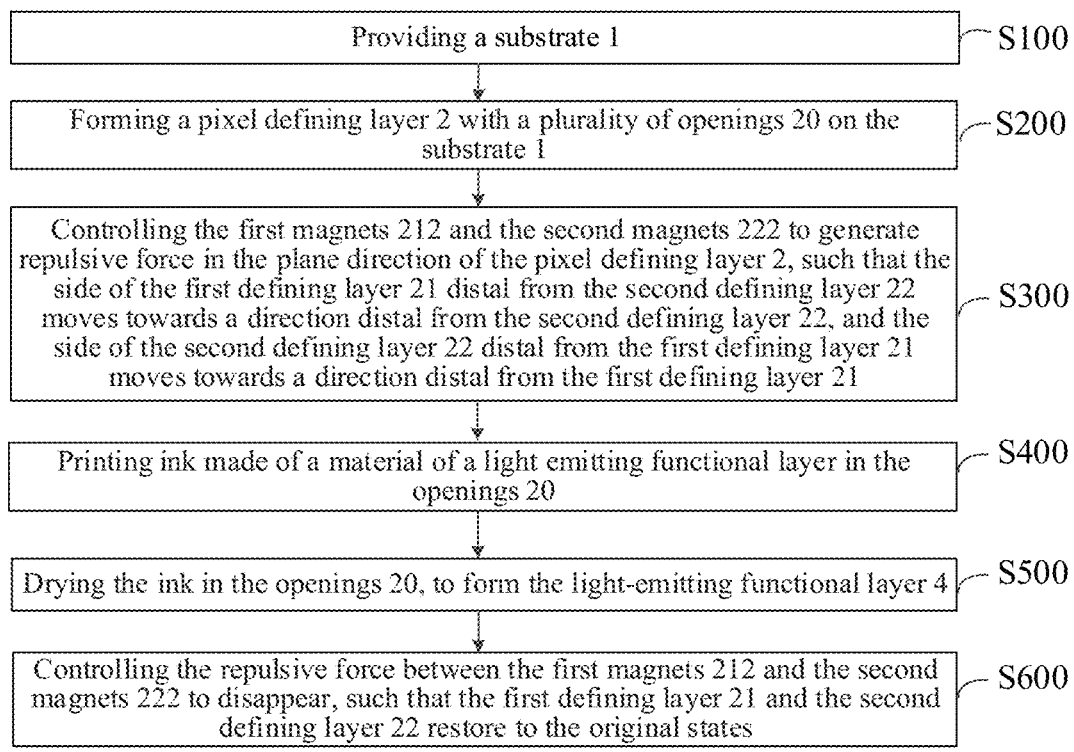
FIG. 18 is a flow chart of a method for manufacturing a display panel according to an embodiment of the present disclosure.

An embodiment of the present disclosure further provides a method for manufacturing the above display panel. Referring to the flow chart of the method as shown in FIG. 18, the method includes the following steps.

In S100, a substrate 1 is provided.

In this step, a drive circuit and a pixel electrode are provided on the substrate 1 through conventional processes.

In S200, a pixel defining layer 2 with a plurality of openings 20 is formed on the substrate 1.

Referring to FIG. 4, the openings 20 of the pixel defining layer 2 may expose the pixel electrodes 6 thereunder. A portion of the pixel defining layer 2 which is disposed between at least partial adjacent two openings 20 includes a first defining layer 21 and a second defining layer 22. The first defining layer 21 includes a first base body 211 dispersed with first magnets 212, and the second defining layer 22 includes a second base body 221 dispersed with second magnets 222. Both the first base body 211 and the second base body 221 are hydrophobic and elastic, and a side face of the first base body 211 which is perpendicular to the bearing surface of the substrate 1 (i.e., the plane direction of the pixel defining layer 2) and a side face of the second base body 221 which is perpendicular to the bearing surface of the substrate 1 are in contact with each other.

The pixel defining layer 2 with the above structure may be formed with appropriate method based on the properties of materials of each part.

Figure 19:
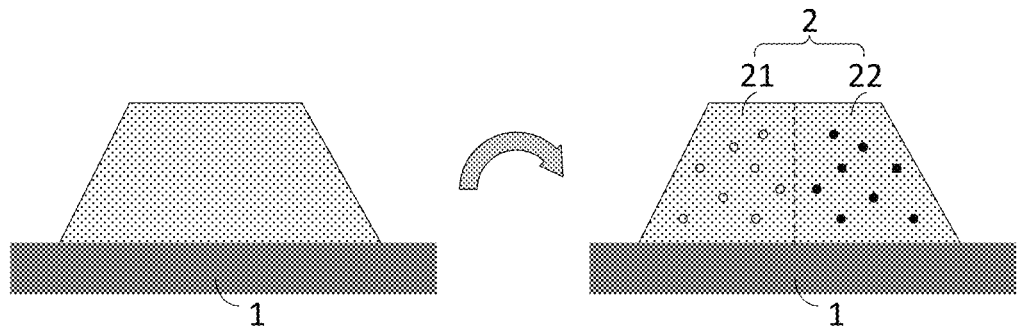
FIG. 19 is a schematic diagram of a first method for preparing a pixel defining layer according to an embodiment of the present disclosure.

In an embodiment, the material of the first base body 211 is the same as that of the second base body 221, and the first base body 211 and the second base body 221 are an integral structure. On this basis, as shown in FIG. 19, the first base body 211 and the second base body 221 may be formed once in the same step. Then, the first magnets 212 are added in the first base body 211, the second magnets 222 are added in the second base body 221, to form the first defining layer 21 and the second defining layer 22. The first base body 211 and the second base body 221 may be formed by ways such as silk screen printing or imprinting. When the materials are photosensitive, the first base body 211 and the second base body 221 may also be formed through exposure and developing.

Figure 20:
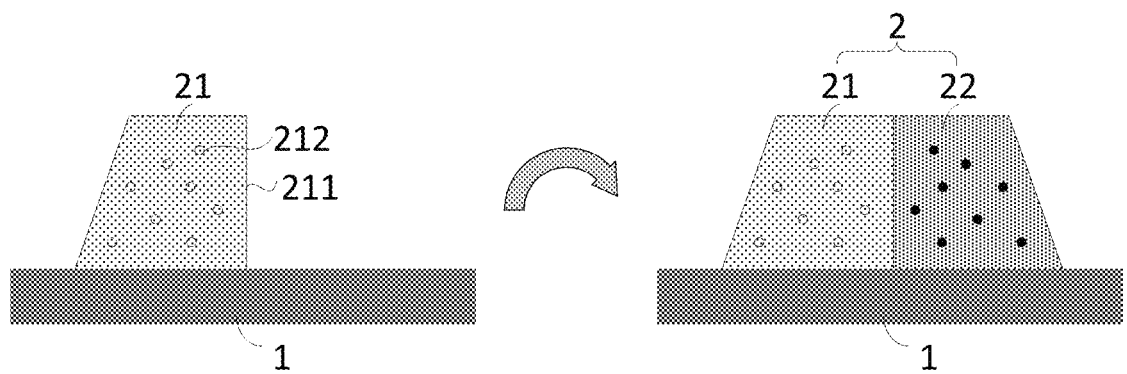
FIG. 20 is a schematic diagram of a second method for preparing a pixel defining layer according to an embodiment of the present disclosure.

In another embodiment, the first base body 211 and the second base body 221 are two independent structures made separately. For example, as shown in FIG. 20, the first magnets 212 may be firstly dispersed in a liquid first base body 211, then the first base body 211 is formed on the substrate 1 through exposure and developing, silk screen printing, imprinting or the like, to obtain the first defining layer 21. With the same method, the second magnets 222 are dispersed in a liquid second base body 221, and then the second base body 221 is formed on the substrate 1 through silk screen printing, imprinting or the like, to obtain the second defining layer 22 after a final curing process.

It should be noted that materials of the defining layer with a relatively good dispersity may be acquired by dispersing the magnets in the base in advance. The order of forming the first defining layer 21 and the second defining layer 22 is not limited. When the first defining layer 21 and the second defining layer 22 are prepared through silk screen printing, imprinting or the like, it's ensured that the first base body 211 and the second base body 221 can be in contact with each other by controlling printing parameters. In this embodiment, adhesive materials are used to form the first base body 211 and the second base body 221, such that the first base body 211 and second base body 221 which are formed separately can be bonded to be an integral structure, and is not separated in the subsequent stretching process.

In this step, by controlling the shape of the first base body 211 and the shape of the second base body 221, the distance from the left side of the first defining layer 21 to the right side of the second defining layer 22 may be controlled to decrease gradually from the bottom to the top, that is, the regular trapezoid shaped structure as shown in the figure is formed, which can prevent break in the subsequent process of preparing the cathode layer.

In S300, the first magnets 212 and the second magnets 222 are controlled to generate repulsive force in the plane direction of the pixel defining layer 2, such that the side of the first defining layer 21 distal from the second defining layer 22 moves towards a direction distal from the second defining layer 22, and the side of the second defining layer 22 distal from the first defining layer 21 moves towards a direction distal from the first defining layer 21.

In this embodiment, a magnetic field is applied to control the first magnets 212 and the second magnets 222 to generate the repulsive force in the horizontal direction. Referring to FIG. 12 and FIG. 13, when the first magnets 212 are permanent magnets with the magnetic property towards the left, and the second magnets are paramagnets, a rightward magnetic field is applied to the second magnets 222, and the second magnets 222 may generate magnetic force towards the right, such that repulsive force is formed between the first defining layer 21 and the second defining layer 22.

In this step, the strength of the magnetic fields is controlled, such that the sides of the first defining layer 21 and the second defining layer 2 move towards two sides. After the left side of the first defining layer 21 and the right side of the second defining layer 22 move, the distance therebetween increases gradually from the bottom to the top, that is, the shape of the pixel defining layer 2 is changed from a regular trapezoid to an inverted trapezoid. As shown in FIG. 9 to FIG. 11, the inverted trapezoid structure has a better effect of preventing the film layer from climbing.

In this step, if the first base body 211 and the second base body 221 are an integral structure, or contact or are connected with each other, they will not be separated in the process of stretching towards the two sides. In the subsequent inkjet printing process, the pixel defining layer 2 has a relatively good function of protecting the substrate 1 thereunder. If the first base body 211 and the second base body 221 are in contact but are not connected with each other, although there is a gap in the pixel defining layer 2, the gap disappears when the repulsive force is removed, and printing of the organic functional layer 4 is not affected in the subsequent process.

In S400, ink made of a material of a light emitting functional layer is printed in the openings 20.

Optionally, the ink made of the material of the light emitting functional layer is printed in the openings 20 through an inkjet printing process.

In S500, the ink in the openings 20 is dried, to form the light-emitting functional layer 4.

Referring to FIG. 7, it shows the formed light-emitting functional layer 4. Optionally, the light-emitting functional layer 4 may be any organic functional film layer such as a hole transport layer, a hole injection layer, a hole block layer, an electron transport layer, an electron injection layer, an electron block layer or a light-emitting layer, which is not limited in the embodiments of the present disclosure.

Since the pixel defining layer 2 in S300 is deformed, for example, it is deformed to be an inverted trapezoid shaped structure, it has a stronger hydrophobic function to the ink droplets 3 dropped in the openings 20 in this step, and cross color does not easily occur in ink droplets 3 between adjacent sub-pixels. In addition, the angle of slope of the pixel defining layer 2 is larger, the film layer does not easily climb. Therefore, the film layer formed after the ink is dried may be concentered in the area of the openings 20 and have a better flatness.

In S600, the repulsive force between the first magnets 212 and the second magnets 222 is controlled to disappear, such that the first defining layer 21 and the second defining layer 22 restore to the original states.

In the embodiment of the present disclosure, the applied magnetic field may be removed such that the magnetic property of the paramagnets disappears, and thus the repulsive force between the first magnets 212 and the second magnets 222 in the horizontal direction disappears, and the first defining layer 21 and the second defining layer 22 restore to the original states.

It should be noted that, with regard to the integral structure of the pixel defining layer as shown in FIG. 15, the entire pixel defining layer 2 needs to be divided into two parts; with regard to the integral structure of the pixel defining layer as shown in FIG. 16, the entire pixel defining layer 2 needs to be divided into four parts. The specific processes are similar and are not be repeated herein.

Furthermore, the method for manufacturing the display panel may further include forming a cathode layer, or forming a pixel defining base layer 5 before forming the pixel defining layer 2, and then forming the pixel defining layer 2 on the side of the pixel defining base layer 5 distal from the substrate 1. The material of the pixel defining base layer 5 may be a hydrophilic material. The method for forming the film layers is not limited in the embodiments of the present disclosure.

The above method for manufacturing the display panel is applicable display panels with a requirement of high resolution. Under the premise of without increasing the width of the pixel defining layer, this method can effectively prevent cross color from occurring in ink droplets of the organic functional layer, thereby ensuring pure light-emitting color of the sub-pixels. In addition, since the flatness of the organic functional layer is improved after the ink droplets are dried, the uniformity of brightness of the finally formed device after being lighted up is improved, which improves the display effect of the display panel.

Figure 21:
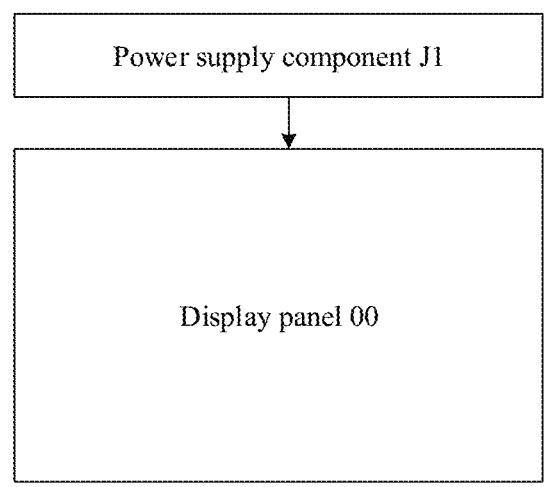
FIG. 21 is a schematic diagram of a structure of a display device according to an embodiment of the present disclosure.

An embodiment of the present disclosure further provides a display device. Referring to FIG. 21, the display device may include a power supply component J1 and a display panel 00 as shown in any one of FIG. 4 to FIG. 17.

The power supply component J1 may be connected to the display panel 00, and the power supply component J1 is configured to supply power to the display panel 00. Since the display device includes the above display panel, it has the same beneficial effect as the display panel, which is not repeated herein.

The application of the display device is not specifically limited in the present disclosure. The display device may be any product or component having a flexible display function, such as a television, a notebook computer, a tablet computer, a wearable display device, a mobile phone, a vehicle display, a navigator, electronic paper, a digital photo frame, an advertising lighting box, or the like.

Opposite terms such as "top" and "bottom" used in the present disclosure are used in the present disclosure to describe a relative relation of one component with respect to another component indicated by the reference signs. These terms are merely used for the convenience of illustration, for example, along the example direction as shown in the drawings. It should be understood that if an apparatus indicated by the reference sign is overturned such that it is made upside down, then the component described as being at the "top" will become a component at the "bottom". When a structure is "on" another structure, it may be that the structure is formed on the another structure as an integral structure, or the structure is "directly" disposed on the another structure, or the structure is "indirectly" disposed on the another structure through yet another structure. The definitions of terms of "first" and "second" are merely exemplary, and it may also be that the left side is "second" and the right side is "first".

The terms "one", "a", "the", "said" and "at least one" are merely used to indicate the existence of one or a plurality of elements/components/and the like, and the terms "include" and "have" refer to a nonexclusive expression, Which means that there may be other elements/components/and the like, besides the listed elements/components/and the like.

Other embodiments of the present disclosure may be apparent to those skilled in the art based on considering the specification and implementing the present disclosure. The embodiments of the present disclosure aim to cover any variations, uses, or adaptations of the present disclosure, which follow the general principles thereof and include common knowledge or commonly used technical measures in the art which are not disclosed herein. The specification and embodiments are considered to be exemplary only, and the true scope and spirit of the present disclosure are indicated by the appended claims.

What is claimed is:

1. A display panel, comprising:
 a substrate; and
 a pixel defining layer disposed on the substrate, the pixel defining layer comprising a plurality of openings, wherein a portion of the pixel defining layer which is disposed between at least partial adjacent two openings of a plurality of adjacent two openings comprises a first defining layer and a second defining layer, wherein the first defining layer comprises a first base body and first magnets dispersed in the first base body, and the second defining layer comprises a second base body and second magnets dispersed in the second base body, both the first base body and the second base body being hydrophobic and elastic, and a side face of the first base body perpendicular to a bearing surface of the substrate and a side face of the second base body perpendicular to the bearing surface of the substrate being in contact with each other,
 wherein the first magnets and the second magnets are capable of generating repulsive force in a direction parallel to the bearing surface of the substrate, such that a side of the first defining layer distal from the second defining layer is movable towards a direction distal from the second defining layer, and a side of the second defining layer distal from the first defining layer is movable towards a direction distal from the first defining layer; and the first defining layer and the second defining layer is capable of restoring to original states after the repulsive force disappears.

2. The display panel according to claim 1, wherein the first magnets are permanent magnets, and the second magnets are paramagnets.

3. The display panel according to claim 2, wherein a material of the permanent magnets comprises an Al—Ni—Co material, a Fe—Cr—Co material or a rare-earth material, and a material of the paramagnet comprises lithium or sodium.

4. The display panel according to claim 1, wherein both a material of the first base body and a material of the second base body are adhesive, and the first base body and the second base body bond together to be an integral structure in the direction parallel to the bearing surface of the substrate.

5. The display panel according to claim 4, wherein both the material of the first base body and the material of the second base body comprise adhesive rubber or thermoplastic resin.

6. The display panel according to claim 1, wherein a material of the first base body is the same as a material of the second base body, and the first base body and the second base body are an integral structure.

7. The display panel according to claim 6, wherein both the material of the first base body and the material of the second base body comprise an organic material of fluoropolymer rubber.

8. The display panel according to claim 1, wherein the plurality of openings are arranged along a row direction and a column direction in an array; and
the portion of the pixel defining layer comprising the first defining layer and the second defining layer is disposed between any two adjacent openings in the row direction.

9. The display panel according to claim 1, wherein a distance from the side of the first defining layer distal from the second defining layer to the side of the second defining layer distal from the first defining layer decreases gradually in a direction distal from the substrate.

10. The display panel according to claim 1, further comprising:
a pixel defining base layer, wherein the pixel defining base layer is disposed between the substrate and the pixel defining layer, and a material of the pixel defining base layer is a hydrophilic material.

11. The display panel according to claim 10, further comprising:
a pixel electrode, wherein the pixel electrode is disposed on the substrate and exposed from the opening; and the pixel defining base layer further covers an edge area of the pixel electrode.

12. The display panel according to claim 11, wherein the first magnets are permanent magnets, and the second magnets are paramagnets, wherein a material of the permanent magnets comprises an Al—Ni—Co materials, a Fe—Cr—Co material or a rare-earth material, and a material of the paramagnets comprises lithium or sodium;
both a material of the first base body and a material of the second base body are adhesive, and the first base body and the second base body bond together to be an integral structure in the direction parallel to the bearing surface of the substrate;
both the material of the first base body and the material of the second base body comprise adhesive rubber or thermoplastic resin;
the plurality of openings are arranged along a row direction and a column direction in an array;
the portion of the pixel defining layer comprising the first defining layer and the second defining layer is disposed between any two adjacent openings in the row direction; and
a distance from the side of the first defining layer distal from the second defining layer to the side of the second defining layer distal from the first defining layer decreases gradually in a direction distal from the substrate.

13. The display panel according to claim 11, wherein the first magnets are permanent magnets, and the second magnets are paramagnets, wherein a material of the permanent magnets comprises an Al—Ni—Co material, a Fe—Cr—Co material or a rare-earth material, and a material of the paramagnets comprises lithium or sodium;
a material of the first base body is the same as a material of the second base body, and the first base body and the second base body are an integral structure;
both the material of the first base body and the material of the second base body comprise an organic material of fluoropolymer rubber;
the plurality of openings are arranged along a row direction and a column direction in an array;
the portion of the pixel defining layer comprising the first defining layer and the second defining layer is disposed between any two adjacent openings in the row direction; and
a distance from the side of the first defining layer distal from the second defining layer to the side of the second defining layer distal from the first defining layer decreases gradually in a direction distal from the substrate.

14. A display device, comprising a power supply component and a display panel, wherein the power supply component is connected to the display panel, and the power supply component is configured to supply power to the display panel; and the display panel comprises:
a substrate;
a pixel defining layer disposed on the substrate, the pixel defining layer comprising a plurality of openings, wherein a portion of the pixel defining layer which is disposed between at least partial adjacent two openings of a plurality of adjacent two openings comprises a first defining layer and a second defining layer, wherein the first defining layer comprises a first base body and first magnets dispersed in the first base body, and the second defining layer comprises a second base body and second magnets dispersed in the second base body, both the first base body and the second base body being hydrophobic and elastic, and a side face of the first base body perpendicular to a bearing surface of the substrate and a side face of the second base body perpendicular to the bearing surface of the substrate being in contact with each other,
wherein the first magnets and the second magnets are capable of generating repulsive force in a direction parallel to the bearing surface of the substrate, such that a side of the first defining layer distal from the second defining layer is movable towards a direction distal from the second defining layer, and a side of the second defining layer distal from the first defining layer is movable towards a direction distal from the first defining layer; and the first defining layer and the second defining layer is capable of restoring to original states after the repulsive force disappears.

15. A method for manufacturing a display panel, comprising:
providing a substrate;
forming a pixel defining layer comprising a plurality of openings on the substrate, a pixel defining layer disposed on the substrate, wherein a portion of the pixel defining layer which is disposed between at least partial adjacent two openings of a plurality of adjacent two openings comprises a first defining layer and a second defining layer, wherein the first defining layer comprises a first base body and first magnets dispersed in the first base body, and the second defining layer comprises a second base body and second magnets dispersed in the second base body, both the first base body and the second base body being hydrophobic and elastic, and a side face of the first base body perpendicular to a bearing surface of the substrate and a side face of the second base body perpendicular to the bearing surface of the substrate being in contact with each other;
controlling the first magnets and the second magnets to generate repulsive force in a direction parallel to the bearing surface of the substrate, such that a side of the first defining layer distal from the second defining layer moves towards a direction distal from the second defining layer, and a side of the second defining layer distal from the first defining layer moves towards a direction distal from the first defining layer;

printing ink made of a material of a light emitting functional layer in the openings;

forming the light-emitting functional layer by drying the ink in the openings; and controlling the repulsive force between the first magnets and the second magnets to disappear, such that the first defining layer and the second defining layer restore to original states.

16. The method according to claim 15, wherein when the pixel defining layer comprising the first defining layer and the second defining layer is formed, a distance from the side of the first defining layer distal from the second defining layer to the side of the second defining layer distal from the first defining layer decreases gradually in a direction distal from the substrate.

17. The method according to claim 15, wherein the first magnets are permanent magnets, and the second magnets are paramagnets;

controlling the first magnets and the second magnets to generate the repulsive force in the direction parallel to the bearing surface of the substrate comprises:

applying a magnetic field to the first magnets and the second magnets, such that magnetic force of the first magnets and magnetic force of the second magnets repel each other; and controlling the repulsive force between the first magnets and the second magnets to disappear comprises:

removing the magnetic field.

18. The method according to claim 17, wherein controlling the first magnets and the second magnets to generate the repulsive force in the direction parallel to the bearing surface of the substrate comprises:

controlling strength of the magnetic field, such that a distance from the side of the first defining layer distal from the second defining layer to the side of the second defining layer distal from the first defining layer increases gradually in a direction distal from the substrate after the side of the first defining layer and the side of the second defining layer move.

19. The method according to claim 15, wherein printing the ink made of the material of the light emitting functional layer in the openings comprises:

printing the ink made of the material of the light emitting functional layer in the openings through an inkjet printing process.

20. The method according to claim 15, wherein before forming the pixel defining layer comprising the plurality of openings on the substrate, the method further comprises:

forming a pixel defining base layer on the substrate, wherein a material of the pixel defining base layer is a hydrophilic material; and forming the pixel defining layer comprising the plurality of openings on the substrate comprises:

forming the pixel defining layer comprising the plurality of openings on a side of the pixel defining base layer distal from the substrate.

* * * * *